(12) United States Patent
Hamada et al.

(10) Patent No.: US 10,966,332 B2
(45) Date of Patent: Mar. 30, 2021

(54) STRUCTURED FABRICS FOR ELECTRONIC DEVICES

(71) Applicant: Apple Inc., Cupertino, CA (US)

(72) Inventors: Yohji Hamada, Wakayama (JP); John J. Baker, Campbell, CA (US); Peter F. Coxeter, Sunnyvale, CA (US); Benjamin M. Rappoport, Santa Barbara, CA (US); Joseph B. Walker, Campbell, CA (US)

(73) Assignee: Apple Inc., Cupertino, CA (US)

( * ) Notice: Subject to any disclaimer, the term of this patent is extended or adjusted under 35 U.S.C. 154(b) by 655 days.

(21) Appl. No.: 15/891,533

(22) Filed: Feb. 8, 2018

(65) Prior Publication Data

US 2018/0168059 A1    Jun. 14, 2018

Related U.S. Application Data

(63) Continuation of application No. 14/579,953, filed on Dec. 22, 2014, now Pat. No. 9,894,789.

(51) Int. Cl.
| | |
|---|---|
| *B32B 3/26* | (2006.01) |
| *B32B 5/02* | (2006.01) |
| *H05K 5/03* | (2006.01) |
| *B32B 37/12* | (2006.01) |
| *B32B 37/18* | (2006.01) |
| *B32B 38/00* | (2006.01) |

(52) U.S. Cl.
CPC ............. *H05K 5/03* (2013.01); *B32B 3/266* (2013.01); *B32B 5/026* (2013.01); *B32B 37/12* (2013.01); *B32B 37/18* (2013.01); *B32B 38/0004* (2013.01); *B32B 38/0008* (2013.01); *B32B 2250/03* (2013.01); *B32B 2305/182* (2013.01); *B32B 2457/00* (2013.01); *Y10T 428/24273* (2015.01); *Y10T 428/24306* (2015.01); *Y10T 428/24322* (2015.01)

(58) Field of Classification Search
CPC ........................................................ B32B 5/026
See application file for complete search history.

(56) References Cited

U.S. PATENT DOCUMENTS

| | | | |
|---|---|---|---|
| 4,112,161 | A | 9/1978 | Sorrells |
| 8,395,465 | B2 | 3/2013 | Lauder et al. |
| 8,718,729 | B1 | 5/2014 | Kershenstein |
| 2013/0043778 | A1 | 2/2013 | Bennett, Jr. |
| 2014/0043748 | A1 | 2/2014 | Sartee et al. |
| 2014/0216954 | A1 | 8/2014 | Law et al. |

*Primary Examiner* — Jenna L Johnson
(74) *Attorney, Agent, or Firm* — Treyz Law Group, P.C.; Kendall W. Abbasi

(57) ABSTRACT

Electronic equipment may include structured fabric. Structured fabric may be used as a protective case or cosmetic cover for an electronic device, may be used to form a band that holds an electronic device against a user's body, or may be used to cover one or more openings in an electronic device. Structured fabrics may be soft and pliable while maintaining the ability to hold a given shape without added support. Structured fabric may be formed by laminating fabric such as warp-knit fabric with a stiffener such as polymer film. Structured fabrics may include openings through which signals such as optical or audio signals pass. To maintain the geometry and shape of the openings in the structured fabric without covering the openings, the stiffener and adhesive that are attached to the fabric may be cut to form a pattern of openings that align with the openings in the fabric.

20 Claims, 12 Drawing Sheets

STRUCTURED FABRICS FOR ELECTRONIC DEVICES

This application is a continuation of U.S. patent application Ser. No. 14/579,953, filed Dec. 22, 2014, which is hereby incorporated by reference herein in its entirety.

BACKGROUND

This relates generally to electronic devices and, more particularly, to electronic devices having structured fabric.

Electronic devices can be formed from fabric or can have portions that are formed from or covered with fabric. The fabric-based electronic device may be worn or held by a user. In some situations, the fabric may be used to hold an electronic device against a user's wrist, arm, or other part of the body. In other situations, a fabric can form a housing component, case, or protective cover for an electronic device.

Because of its softness and lack of rigidity, fabric is typically regarded as unsuitable for use as a structural component in an electronic device. Rigid structures such as meshes and protective cases are typically formed using metal or plastic. Plastic cases and metal meshes may be satisfactory in certain situations, but some users may desire a different look and feel.

It would be desirable to be able to address these concerns by providing improved techniques for incorporating structure and rigidity into fabric for an electronic device.

SUMMARY

Electronic equipment may include structured fabric. Structured fabric may be used as a protective case or cosmetic cover for an electronic device, may be used to form a band that holds an electronic device against a user's body, or may be used to cover one or more openings in an electronic device.

Structured fabrics may be soft and pliable while maintaining the ability to hold a given shape without added support. Structured fabric may be formed by laminating fabric such as warp-knit fabric with a stiffener such as polymer film. Structured fabrics may include openings through which signals such as optical or audio signals pass. To maintain the geometry and shape of the openings in the structured fabric without covering the openings, the stiffener and adhesive that are attached to the fabric may be cut to form a pattern of openings that align with the openings in the fabric.

The stiffener, adhesive, and fabric may be placed between upper and lower mold structures during the lamination process. The lower mold structure may include alignment posts that help align the fabric with the stiffener and adhesive. For example, the lower mold structure may include alignment posts having a shape, size, and spacing that matches the shape, size, and spacing of openings in the fabric. Each alignment post may be inserted into a respective opening in the fabric, a respective opening in the adhesive layer, and a respective opening in the polymer film. Heat and pressure may be applied while compressing the fabric, adhesive, and stiffener between the upper and lower mold structures to thereby laminate the fabric to the stiffener using the adhesive.

The structured fabric may be shaped into the appropriate form factor during lamination or may be shaped following lamination. The structured fabric may, for example, have a cylindrical shape to form a hollow tube that surrounds an electronic device or the structured fabric may have any other suitable shape.

DETAILED DESCRIPTION

Figure 1:
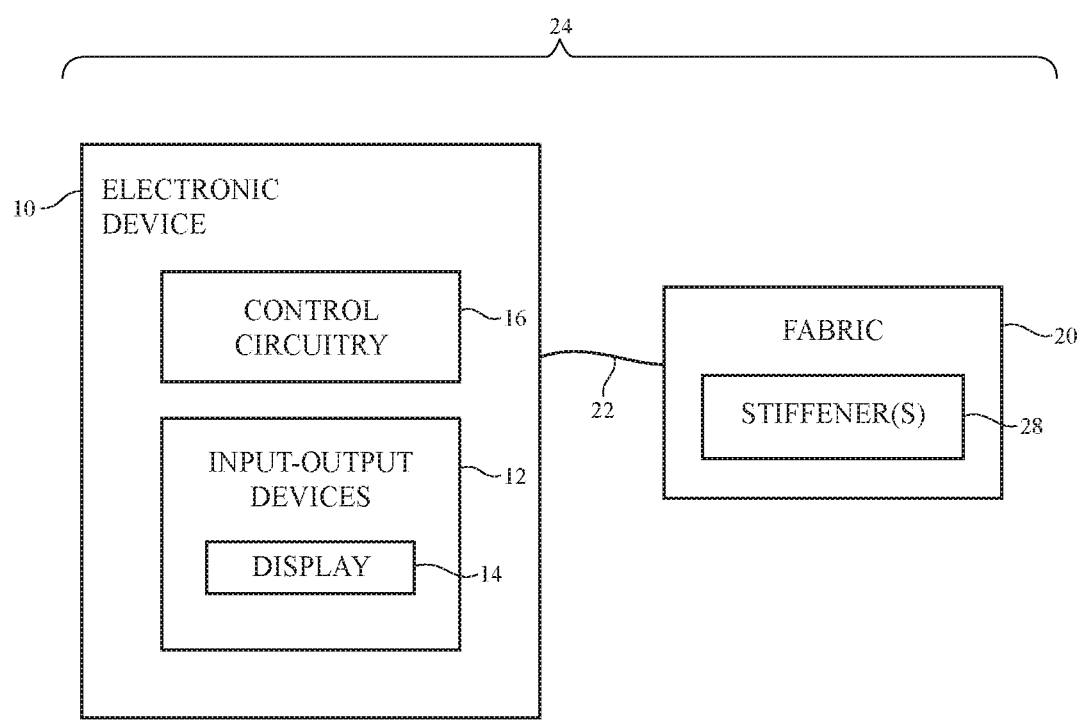
FIG. 1 is a schematic diagram of illustrative electronic equipment having one or more stiffeners incorporated into fabric in accordance with an embodiment.

A schematic diagram of an illustrative fabric-based system that may include one or more stiffeners incorporated into fabric is shown in FIG. 1. Fabric-based electronic equipment 24 of FIG. 1 may include an electronic device such as electronic device 10 and fabric such as fabric 20. Electronic device 10 and fabric 20 may be integral with one another, may be detachable or non-detachable from one another, and/or may be physically separate from one another while maintaining the ability to communicate with each other.

In one illustrative arrangement, fabric 20 in system 24 may be an accessory for electronic device 10. For example, fabric 20 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating, may be part of an item of clothing, or may be any other suitable fabric-based item. If desired, fabric 20 may be used in forming part of an electronic device such as a laptop computer, a computer monitor containing an embedded computer, a tablet computer, a cellular telephone, a speaker, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric-based equipment is mounted in a kiosk, in an automobile or other vehicle, equipment that implements the functionality of two or more of these devices, or other electronic equipment.

Fabric 20 may form all or part of electronic device 10, may form all or part of a housing wall for electronic device 10, may form internal structures in electronic device 10, may cover one or more openings, recesses, or ports in electronic device 10, or may form other fabric-based structures. Fabric-based device 24 may be soft (e.g., the device may have a fabric surface that yields to a light touch), may have a rigid feel (e.g., the surface of the device may be formed form a stiff fabric), may be coarse, may be smooth, may have ribs or other patterned textures, and/or may be formed as part of a device that has portions formed from non-fabric structures of plastic, metal, glass, crystalline materials, ceramics, or other materials.

As shown in FIG. 1, electronic device 10 may include control circuitry 16. Control circuitry 16 may include storage and processing circuitry for controlling the operation of device 10. Control circuitry 16 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 16 may include processing circuitry based on one or more microprocessors, microcontrollers, digital signal processors, baseband processors, power management units, audio codec chips, application specific integrated circuits, etc.

Input-output devices 12 may be used to allow data to be supplied to device 10 and to allow data to be provided from device 10 to external devices. Input-output devices 12 may also include input-output components with which a user can control the operation of device 10. A user may, for example, supply commands through input-output devices 12 and may receive status information and other output from device 10 using the output resources of input-output devices 12.

Input-output devices 12 may include sensors and status indicators such as an ambient light sensor, a proximity sensor, a temperature sensor, a pressure sensor, a magnetic sensor, an accelerometer, a touch sensor, a fingerprint sensor, and light-emitting diodes and other components for gathering information about the environment in which device 10 is operating and providing information to a user of device 10 about the status of device 10. Audio components in devices 12 may include speakers and tone generators for presenting sound to a user of device 10 and microphones for gathering user audio input. Devices 12 may include one or more displays such as display 14. Displays may be used to present images for a user such as text, video, and still images. Sensors in devices 12 may include a touch sensor array that is formed as one of the layers in display 14. During operation, user input may be gathered using buttons and other input-output components in devices 12 such as touch pad sensors, buttons, joysticks, click wheels, scrolling wheels, touch sensors such as a touch sensor array in a touch screen display or a touch pad, key pads, keyboards, vibrators, cameras, and other input-output components. The input-output devices of device 10 may include wired and wireless communications circuitry (e.g., circuitry to support digital data communications, a radio-frequency transceiver and antennas for supporting wireless communications, etc.).

Fabric 20 may be formed from intertwined fibers. Fibers that form fabric 20 may be single-strand filaments or may be threads, yarns, or other fibers that have been formed by intertwining single-strand filaments. Fibers may be formed from polymer, metal, glass, graphite, ceramic, natural materials such as cotton or bamboo, or other organic and/or inorganic materials and combinations of these materials. Conductive coatings such as metal coatings may be formed on non-conductive fiber cores. Fibers may also be formed from single filament metal wire or stranded wire. Fibers may be insulating or conductive. Fibers may be conductive along their entire length or may have conductive segments (e.g., metal portions that are exposed by locally removing polymer insulation from an insulated conductive fiber). Threads and other multi-strand fibers that have been formed from intertwined filaments may contain mixtures of conductive fibers and insulating fibers (e.g., metal fibers or metal coated fibers with or without exterior insulating layers may be used in combination with solid plastic fibers or natural fibers that are insulating).

One or more stiffening structures such as stiffeners 28 may be incorporated into fabric 20. Stiffener 28 may be used to provide rigidity and structure to fabric 20. For example, the shape and structure of fabric 20 and/or the shape and structure of openings in fabric 20 may be maintained using stiffener 28. Stiffener 28 may be formed from a plastic layer (e.g., polyethylene terephthalate, polycarbonate, or other polymer film), a metal sheet (e.g., a thin stainless steel layer), a foam layer, silicone or other elastomeric material, or other rigid layers of plastic, metal, etc.

Stiffeners 28 may be intertwined (e.g., interwoven) with fibers of fabric 20, may be sandwiched between two layers of fabric 20, may be stitched into fabric 20, may be attached to the surface of edge of fabric 20, or may be integrated with fabric 20 using any other suitable method. There may be only one stiffener 28 in fabric 20 or fabric 20 may include multiple stiffeners 28. Stiffeners 28 may be separated into multiple layers of fabric 20 or may be formed in a single layer of fabric 20. Stiffeners 28 may be stacked (e.g., may overlap each other in fabric 20) or may be formed in different regions of fabric 20 (e.g., a first stiffener 28 may be formed in a first portion of fabric 20 and a second stiffener 28 may be formed in a second portion of fabric 20).

Path 22 may form a mechanical, electrical, and/or wireless connection between fabric 20 and electronic device 10. For example, path 22 may be an attachment structure that physically attaches fabric 20 to electronic device 10 and/or path 22 may be or may include conductive pathways that convey electrical signals between electronic device 10 and fabric 20.

Control circuitry 16 may be used to run software on device 10 such as operating system code and applications. During operation of system 24, the software running on control circuitry 16 may display images for a user on display 14 and may use other devices within input-output devices 12. For example, the software running on control circuitry 16 may be used to process input from a user using one or more sensors (e.g., capacitive touch sensors, mechanical sensors, thermal sensors, force sensors, switches, buttons, touch screen displays, and other components) and may be used to provide status indicator output and other visual and/or audio output. Control circuitry 16 may use devices 12 to provide vibrations, pressure, and/or other physical output (e.g., haptic output). Changes in fabric attributes such as fabric temperature, texture, size, and shape may also be produced using devices 12 and/or using output devices in fabric 20 to convey output to a user.

Figure 2:
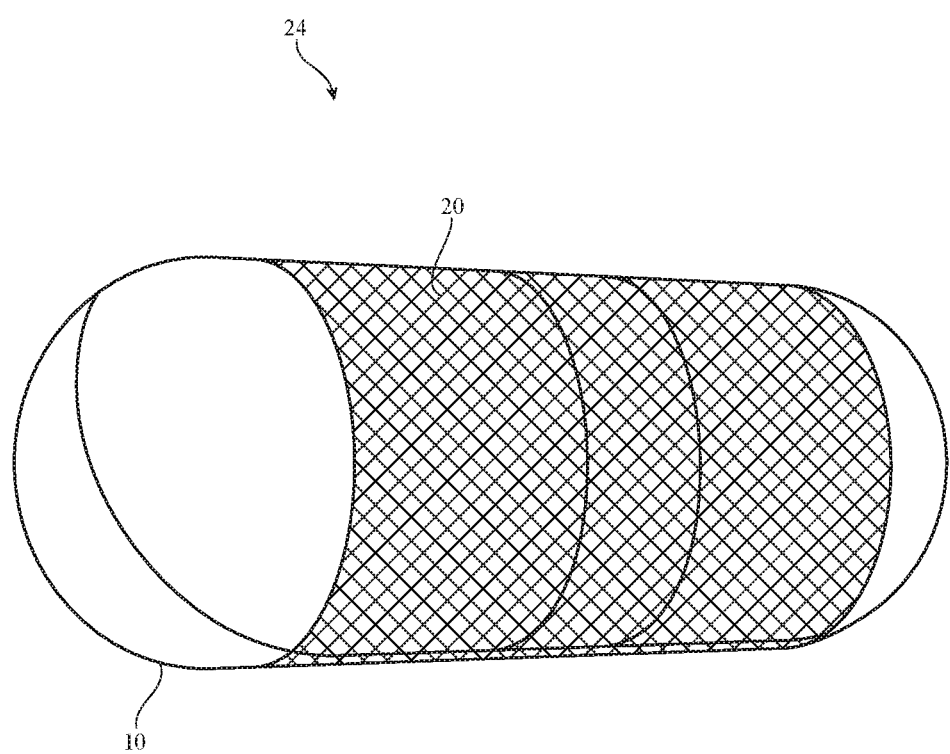
FIG. 2 is a perspective view of illustrative electronic equipment including a structured fabric sleeve for an electronic device in accordance with an embodiment.

A perspective view of illustrative electronic equipment 24 in which fabric 20 forms a removable cover or sleeve for electronic device 10 is shown in FIG. 2. In the example of FIG. 2, electronic device 10 has a capsule-like cylindrical shape, and fabric 20 has a matching cylindrical (tube-like) shape to conform to the outer surface of electronic device 10 when fabric 20 is placed on electronic device 10. Electronic device 10 may, for example, be a speaker device such as BEATS PILL® portable speakers or other suitable speaker device. This is, however, merely illustrative. In general, electronic device 10 may be any suitable type of electronic device having any suitable exterior shape (e.g., cylindrical, rectilinear, round, etc.), and fabric 20 may have a corresponding shape to form a cover or case for electronic device 10.

Fabric 20 may be a warp-knit fabric having fibers that zigzag along the length of the fabric or may be formed from fibers (e.g., warp fibers and weft fibers) woven in a plain weave. In general, fabric 20 may include any intertwined fibers (woven, knitted, braided, etc.). Fabric 20 may contain conductive fibers, may contain a mixture of conductive and insulating fibers, or may be formed exclusively from insulating fibers.

Figure 3:
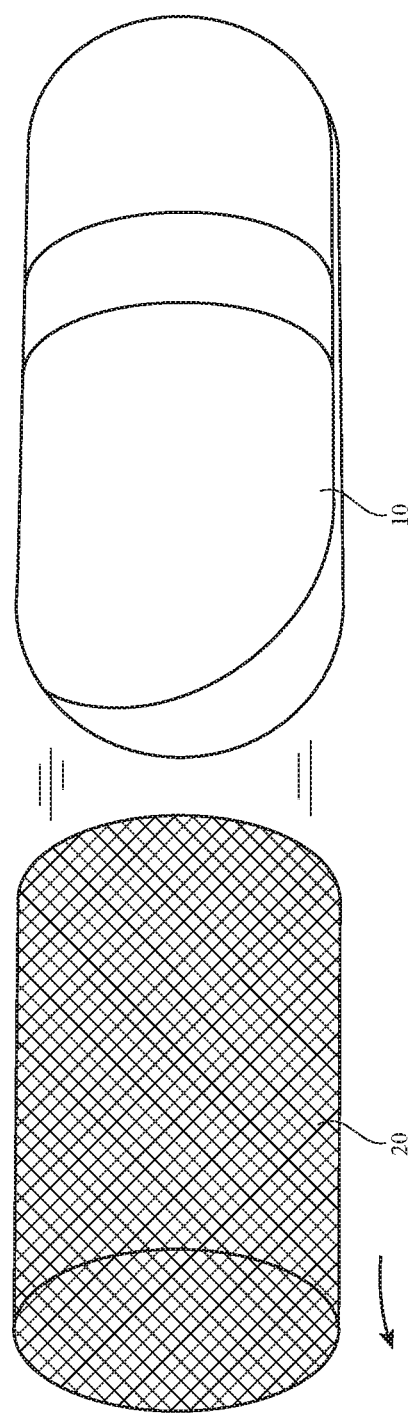
FIG. 3 is a perspective view of the electronic equipment of FIG. 2 showing how a structured fabric sleeve can be removed from an electronic device in accordance with an embodiment.

FIG. 3 is a perspective view of the electronic equipment of FIG. 2 showing how fabric-based cover 20 may be removed from electronic device 10. Fabric-based cover 20 may, for example, be formed from structured fabric that holds its shape even when removed from electronic device 10. As shown in FIG. 3, for example, fabric-based cover 20 maintains a cylindrical shape even when removed from the cylindrical body of electronic device 10.

Figure 4:
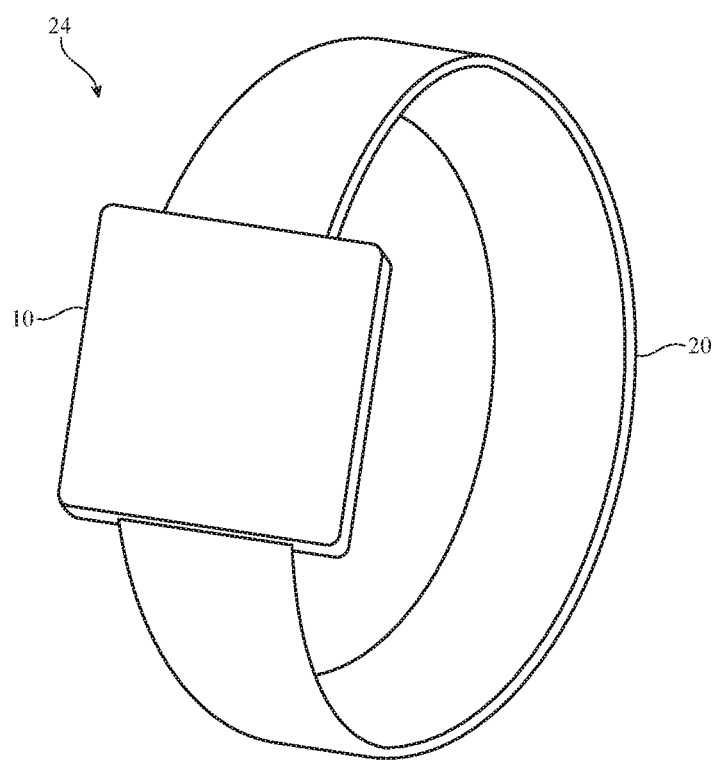
FIG. 4 is a perspective view of illustrative electronic equipment including a structured fabric band attached to an electronic device in accordance with an embodiment.

A perspective view of another illustrative type of fabric-based system is shown in FIG. 4. In the example of FIG. 4, fabric 20 is attached to housing 50 of electronic device 10 and may, for example, be used to attach electronic device 10 to some part of a user's body. For example, fabric 20 may form a wrist band, an arm band, a head band, a waist band, or other article that can be secured against a user's body and that can support or hold electronic device 10 in place (e.g., against a user's skin). The arrangement of FIG. 4 is, however, merely illustrative. In general, electronic device 10 and fabric 20 may be integrated with or attached to one another in any suitable fashion.

It can be difficult to maintain structure and shape in warp-knit fabrics. Without structure and rigidity, warp-knit fabric may be unable to maintain a shape on its own. Patterns in the fabric such as patterned openings may become deformed if not properly supported. To ensure that fabric 20 is able to maintain a desired structure and shape, fabric 20 may include one or more stiffeners. Incorporating stiffeners into fabric 20 may allow fabric 20 to maintain a curved shape as shown in the example of FIGS. 2, 3, and 4. Portions of fabric 20 that include patterns or openings may be provided with rigidity to ensure that the geometry of a pattern or opening is accurately maintained.

Figure 5:
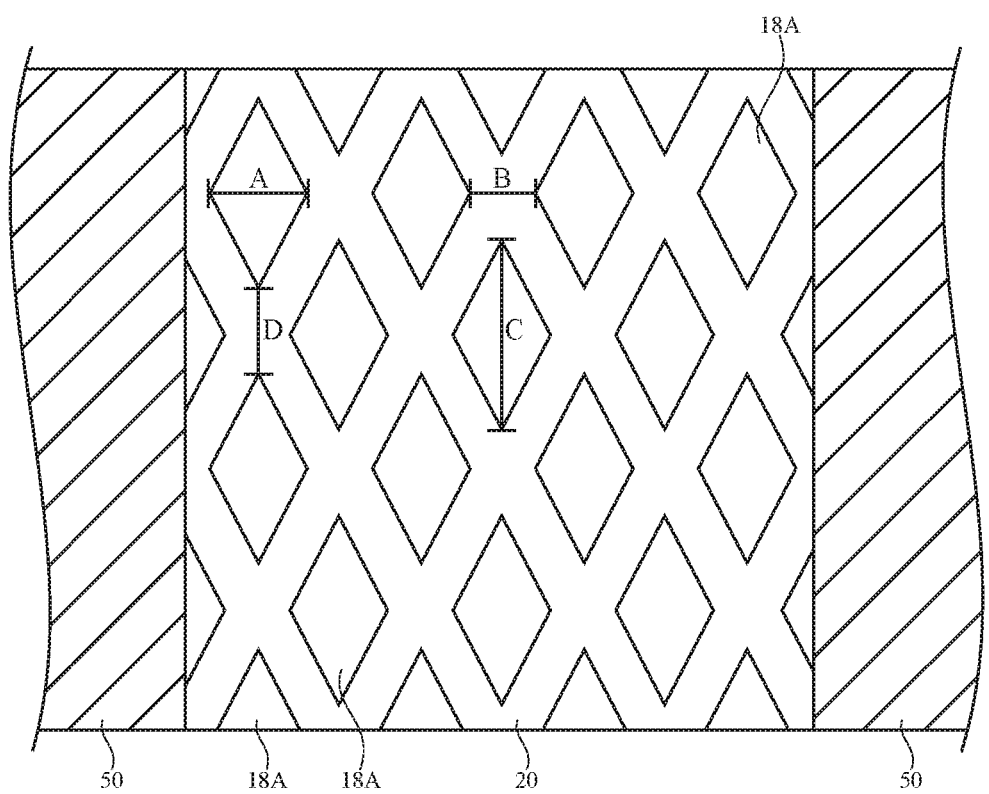
FIG. 5 is a top view of structured fabric having diamond-shaped openings in accordance with an embodiment.

A top view of an illustrative fabric 20 that may be used in equipment 24 is shown in FIG. 5. As shown in FIG. 5, fabric 20 may be attached to housing 50. Fabric 20 may, for example, be attached to opposing edges of an electronic device housing that encloses electronic components (e.g., as in the example of FIG. 4). In other arrangements, fabric 20 may be mounted in or over an opening or recess in housing 50 of an electronic device. For example, fabric 20 may be mounted over an electrical component in housing 50 such as light-emitting diodes, lamps, displays, lasers, or other light-emitting components, vibrators, buzzers, speakers, tone-generators, microphones, or other acoustic components, sensors such as touch sensors, temperature sensors, accelerometers, compasses, gyroscopes, position sensors, proximity sensors, or other suitable electronic components.

As shown in FIG. 5, fabric 20 may include one or more openings such as openings 18A. Openings 18A may provide fabric 20 with a desired aesthetic, may provide fabric 20 with breathability, and/or may provide fabric 20 with pathways through which signals such as optical signals, audio signals, or other signals may pass (e.g., from the interior of housing 50 to the exterior of housing 50 and/or from the exterior of housing 50 to the interior of housing 50). For example, components such as light-emitting components, speakers, or other components may transmit signals through openings 18A in fabric 20.

Figure 6:
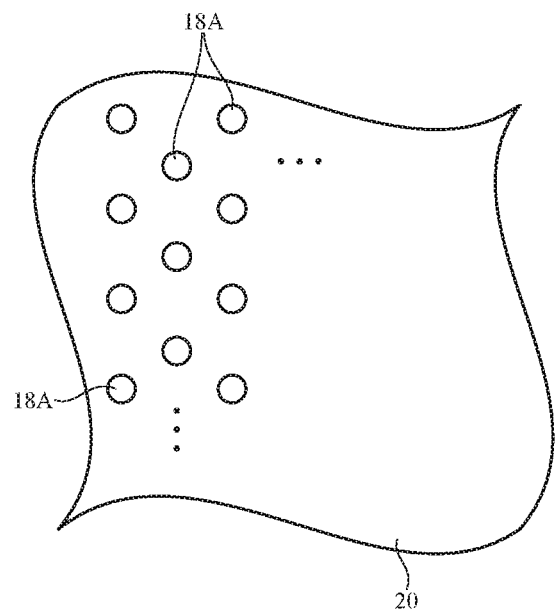
FIG. 6 is a top view of structured fabric having circular openings in accordance with an embodiment.
Figure 7:
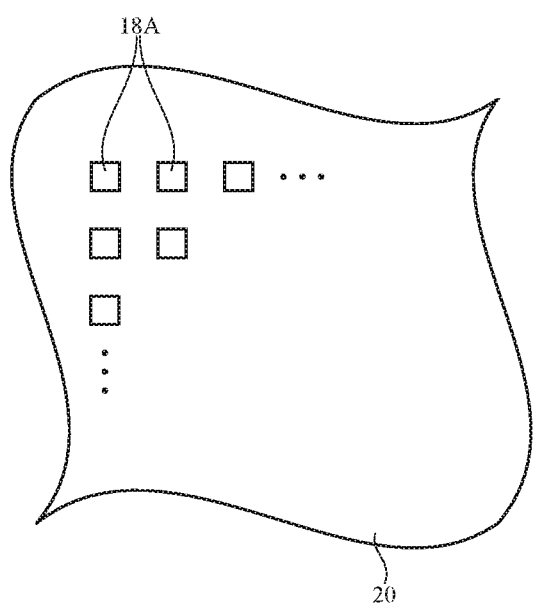
FIG. 7 is a top view of structured fabric having rectangular openings in accordance with an embodiment.

Openings 18A may be relatively large openings (e.g., each spanning a distance of 10 mm, 50 mm, or more than 50 mm) or openings 18A may be relatively small openings (e.g., each spanning a distance of less than 10 mm). For example, in fabric 20 of FIG. 5 with diamond shaped openings 18A, the horizontal distance A spanned by each opening may be between 2 mm and 3 mm, the horizontal distance between adjacent openings 18A may be between 1.5 mm and 2.5 mm, the vertical distance C spanned by each opening may be between 4 mm and 5 mm, and the vertical distance D between adjacent openings 18A may be between 3 mm and 4 mm. These are merely illustrative examples, however. In general, openings 18A may have any suitable size, shape, and spacing. If desired, openings 18A may be circular as shown in FIG. 6, may be rectangular as shown in FIG. 7, or may have any other suitable shape (e.g., an oval shape, a spiral shape, a triangular shape, an annular shape, etc.).

It may be desirable to maintain the geometry and shape of openings 18A in fabric 20. For example, if signals such as optical signals or audio signals are passing through openings 18A in fabric 20, care must be taken to ensure that the flexibility of fabric 20 does not cause fabric 20 to become limp and openings 18A to become blocked or deformed.

Figure 8:
FIG. 8 is a cross-sectional side view of structured fabric having a fabric layer laminated with a stiffener in accordance with an embodiment.

To provide fabric 20 with a desired rigidity, fabric 20 may be laminated with a stiffener as shown in FIG. 8. A shown in FIG. 8, adhesive 26 may adhere a stiffener such as stiffener 28 to fabric layer 20 to form structured fabric 44. In arrangements where fabric 20 does not include openings 18A, adhesive 26 and stiffener 28 may each form a solid contiguous layer on fabric 20. In arrangements where fabric 20 includes visible openings such as openings 18A, adhesive 26 and stiffener 28 may also include openings that align with openings 18A of fabric 20. Aligning openings in adhesive 26 and stiffener 28 with openings 18A of fabric 20 may ensure that signals such as optical signals and/or audio signals can pass through openings 18A in fabric 20. This is, however, merely illustrative. If desired, fabric 20 may include openings 18A that are covered by an adhesive layer and stiffener layer.

Adhesive 26 may be an adhesive tape that includes a flexible layer, sometimes referred to as a carrier or substrate. Pressure sensitive adhesive can be used to coat a single carrier surface or double-sided tape can be formed by coating opposing carrier surfaces with pressure sensitive adhesive. This is, however, merely illustrative. If desired, adhesive 26 may be a chemically activated adhesive (e.g., a two-part adhesive having a hardener and a resin), a thermally activated adhesive that is cured by raising the temperature of the adhesive above room temperature, a light-cured adhesive (e.g., an adhesive cured by application of ultraviolet (UV) light) such as UV epoxy, or other suitable adhesive.

Adhesive 26 may be provided with flexible carriers such as one or more flexible polymer layers. Examples of polymers that may be used as tape carriers include polyester film (i.e., polyethylene terephthalate) and polyimide. Other polymer layers that may be used as pressure sensitive adhesive tape carriers may be used if desired. Tape may be dispensed in the form of elongated strips, in ring shapes (e.g., die cut circular or rectangular rings with open centers), L-shaped and C-shaped patterns, circles, squares, other solid shapes, or other suitable shapes. If desired, stiffener 28 may be used as a tape carrier for adhesive 26 or adhesive 26 may have a carrier that is separate from stiffener 28. If desired, non-stick release liners may be coupled to the exposed surfaces of adhesive 26 during manufacturing to facilitate tape handling.

Stiffener 28 may be formed from a plastic layer (e.g., polyethylene terephthalate, polycarbonate, or other polymer film), a metal sheet (e.g., a thin stainless steel layer), metal wires (e.g., a grid or web of thin metal wires that align with fabric 20 and do not overlap openings 18A), a foam layer, a silicone or other elastomeric material, or other rigid layers of plastic, metal, etc. If desired, stiffener 28 may include multiple layers of stiffening structures, such as a foam layer interposed between opposing polymer film layers.

Figure 9:
FIG. 9 is a cross-sectional side view of structured fabric having a fabric layer laminated with a stiffener and with an additional layer interposed between two adhesive layers in accordance with an embodiment.

FIG. 9 is a cross-sectional side view of another illustrative configuration for structured fabric 44. In the arrangement of FIG. 9, structured fabric 44 includes a first adhesive layer 26A and a second adhesive layer 26B interposed between fabric layer 20 and stiffener 28. An additional layer such as layer 40 may be interposed between adhesive layers 26A and 26B. Layer 40 may be an ink layer (e.g., a conductive ink layer, a non-conductive ink layer, a black ink layer, or other suitable ink layer), a polymer film layer, a metal layer, a thermally conductive layer, or other suitable layer. If desired, layer 40 may be formed selectively (e.g., may be patterned) between fabric 20 and stiffener 28 or may be formed as a single contiguous layer between fabric 20 and stiffener 28. Layer 40 may, for example, form a carrier substrate for adhesive layer 26A and 26B to form a double-sided tape.

Figure 10:
FIG. 10 is a cross-sectional side view of structured fabric having two fabric layers laminated with a stiffener and two adhesive layers in accordance with an embodiment.

FIG. 10 is a cross-sectional side view of another illustrative configuration for structured fabric 44. In the arrangement of FIG. 10, structured fabric 44 includes multiple layers of fabric such as fabric layer 20A and fabric layer 20B laminated with stiffener 28 and adhesive layers 26A and 26B. Stiffener 28 is interposed between first adhesive layer 26A and second adhesive layer 26B, and the adhesive layers 26A and 26B are interposed between outer layers of fabric 20A and 20B. The use of fabric 20 to form the outermost layers of structured fabric 44 can provide a soft surface on both sides of the structured fabric.

Figure 11:
FIG. 11 is a cross-sectional side view of structured fabric having a fabric layer laminated with a stiffener and an additional layer in accordance with an embodiment.

FIG. 11 is a cross-sectional side view of another illustrative configuration for structured fabric 44. In the example of FIG. 11, structured fabric 44 includes only one adhesive layer interposed between fabric 20 and stiffener 28. Layer 40 may be formed between adhesive layer 26 and stiffener 28 (as shown in the example of FIG. 11) and/or layer 40 may be formed between adhesive layer 26 and fabric 20.

Figure 12:
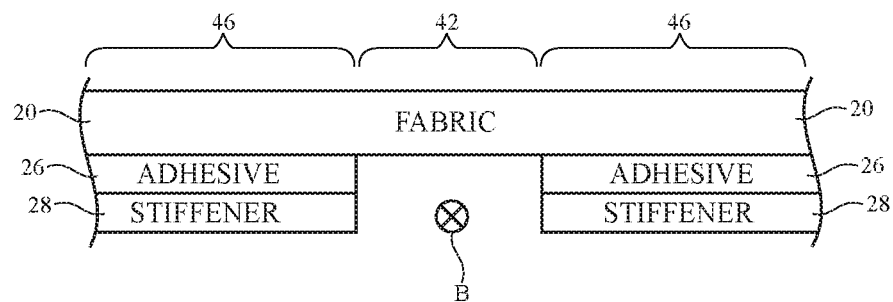
FIG. 12 is a cross-sectional side view of structured fabric having rigid portions laminated with stiffeners and flexible portions without stiffeners in accordance with an embodiment.

FIG. 12 is a cross-sectional side view of structured fabric 40 showing how some portions such as portions 46 of fabric layer 20 may be laminated with a stiffener while other portions such as portions 42 of fabric layer 20 may not include any stiffeners and may therefore remain flexible and bendable. For example, the absence of stiffener 28 in portion 42 of fabric layer 20 may allow portion 42 of fabric layer 20 to bend about bend axis B while portions 46 remain stiff and flat. This is, however, merely illustrative. If desired, all of fabric 20 may be stiff and rigid or fabric 20 may include one or more rigid portions 46 and one or more flexible portions 42.

Figure 13:
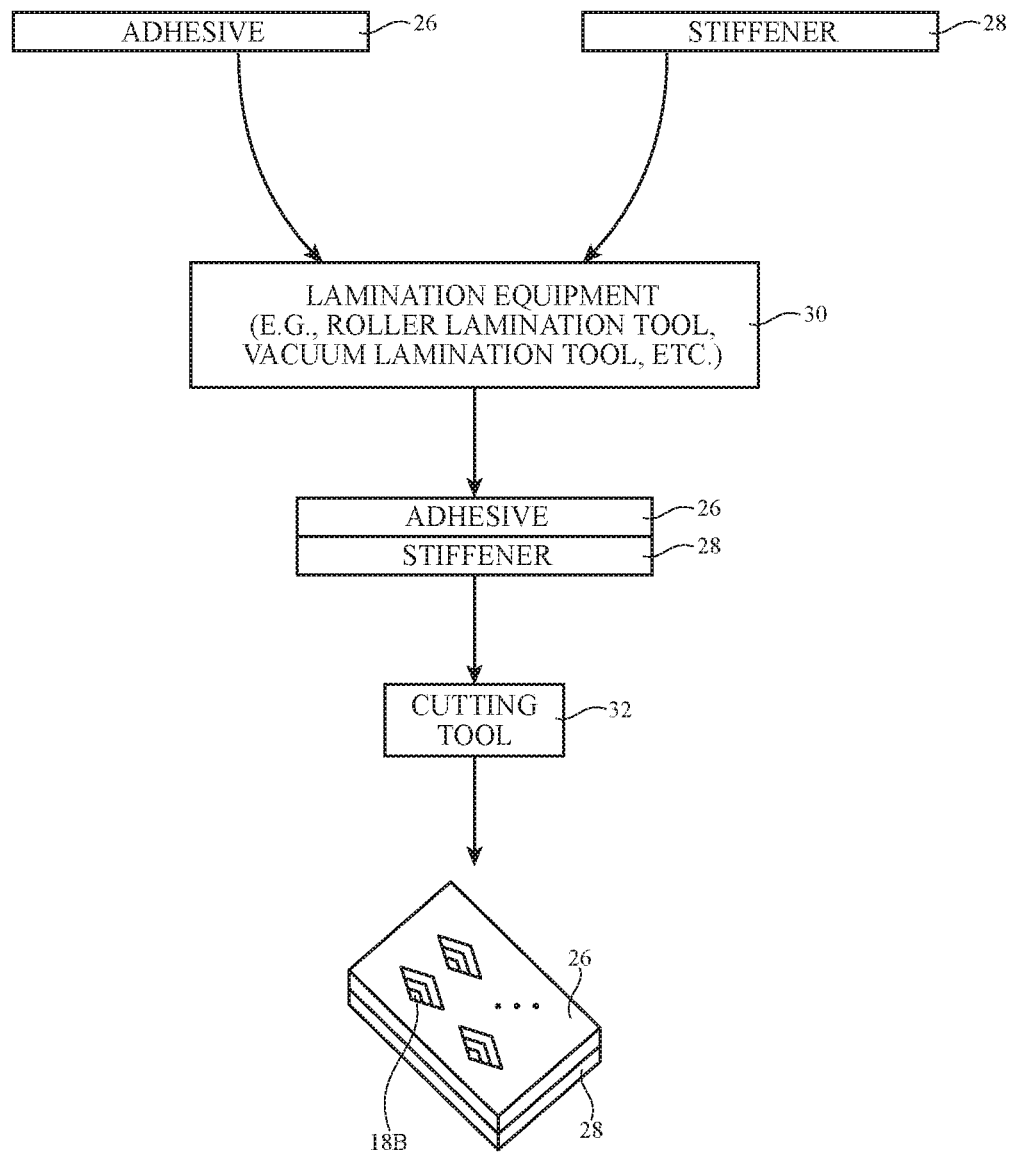
FIG. 13 is a diagram of an illustrative system being used to form a laminated stack with an adhesive layer and a stiffener having a pattern of openings in accordance with an embodiment.

If desired, adhesive 26 and stiffener 28 may be laminated together prior to being attached to fabric layer 20. FIG. 13 is a system diagram showing how adhesive 26 and stiffener 28 may be attached together and provided with a pattern of openings that matches the pattern of openings 18A of fabric 20. As shown in FIG. 13, lamination equipment 30 may be used to laminate adhesive 26 to stiffener 28. Lamination equipment 30 may include a roller laminator, vacuum lamination equipment, or other equipment for attaching adhesive 26 to stiffener 28.

In arrangements where fabric 20 does not include a pattern of openings, stiffener 28 and adhesive 26 may be kept as solid contiguous layers (without openings) and may be laminated with fabric 20 (e.g., using lamination equipment 30). In arrangements where fabric 20 includes a pattern of openings and has a web-like configuration, it may be desirable to cut adhesive 26 and stiffener 28 to have a corresponding pattern of openings and a corresponding web-like configuration.

Cutting equipment such as cutting tool 32 (e.g., die cutting equipment, laser cutting equipment, a cutting blade, or other suitable cutting equipment) may be used to cut or trim adhesive 26 and stiffener 28 into the desired shape. This may include, for example, cutting adhesive 26 and stiffener 28 to form holes 18B in adhesive 26 and stiffener 28. Openings 18B may have a shape, size, and spacing that corresponds to the shape, size, and spacing of openings 18A in fabric 20. Providing adhesive 26 and stiffener 28 with a pattern of openings that matches the pattern of openings in fabric 20 may allow stiffener 28 to provide structure to the portions of fabric 20 that surround openings 18A while ensuring that adhesive material 26 and stiffener material 28 do not overlap with openings 18A in fabric 20.

Figure 14:
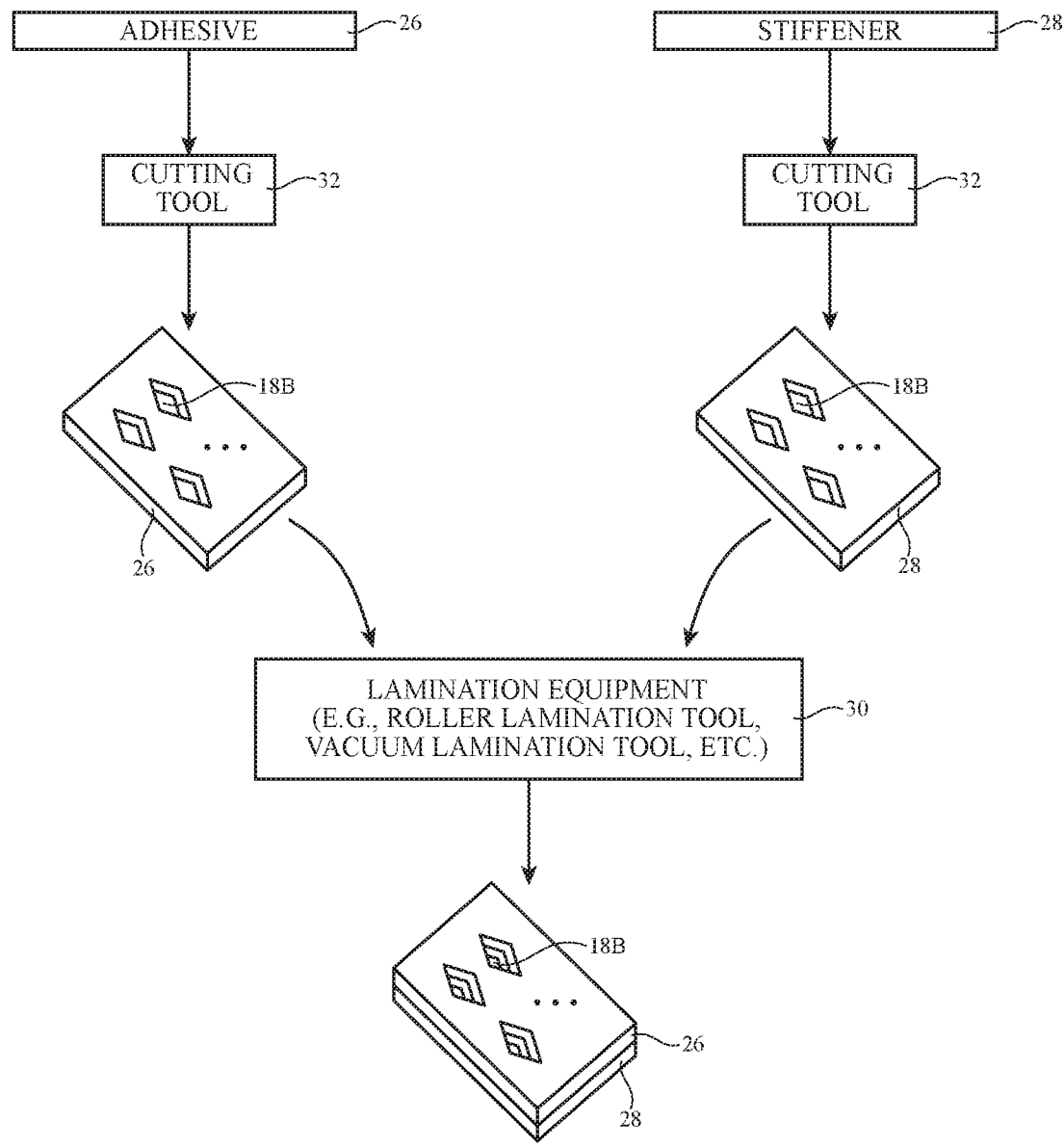
FIG. 14 is a diagram of an illustrative system being used to form a laminated stack with an adhesive layer and a stiffener having a pattern of openings in accordance with an embodiment.

The example of FIG. 13 in which adhesive 26 and stiffener 28 are laminated together prior to cutting openings 18B using cutting tool 32 is merely illustrative. If desired, adhesive 26 and stiffener 28 may each be cut separately prior to being laminated together. This type of arrangement is shown in FIG. 14. As shown in FIG. 14, cutting tool 32 may be used to cut openings 18B in adhesive 26 and in stiffener 28 before adhesive 26 and stiffener 28 are laminated together. Following formation of openings 18B in adhesive 26 and stiffener 28, adhesive 26 and stiffener 28 may aligned such that openings 18B in adhesive 26 align with openings 18B in stiffener 28. Adhesive 26 and stiffener 28 may then be laminated together using lamination equipment 30.

Figure 15:
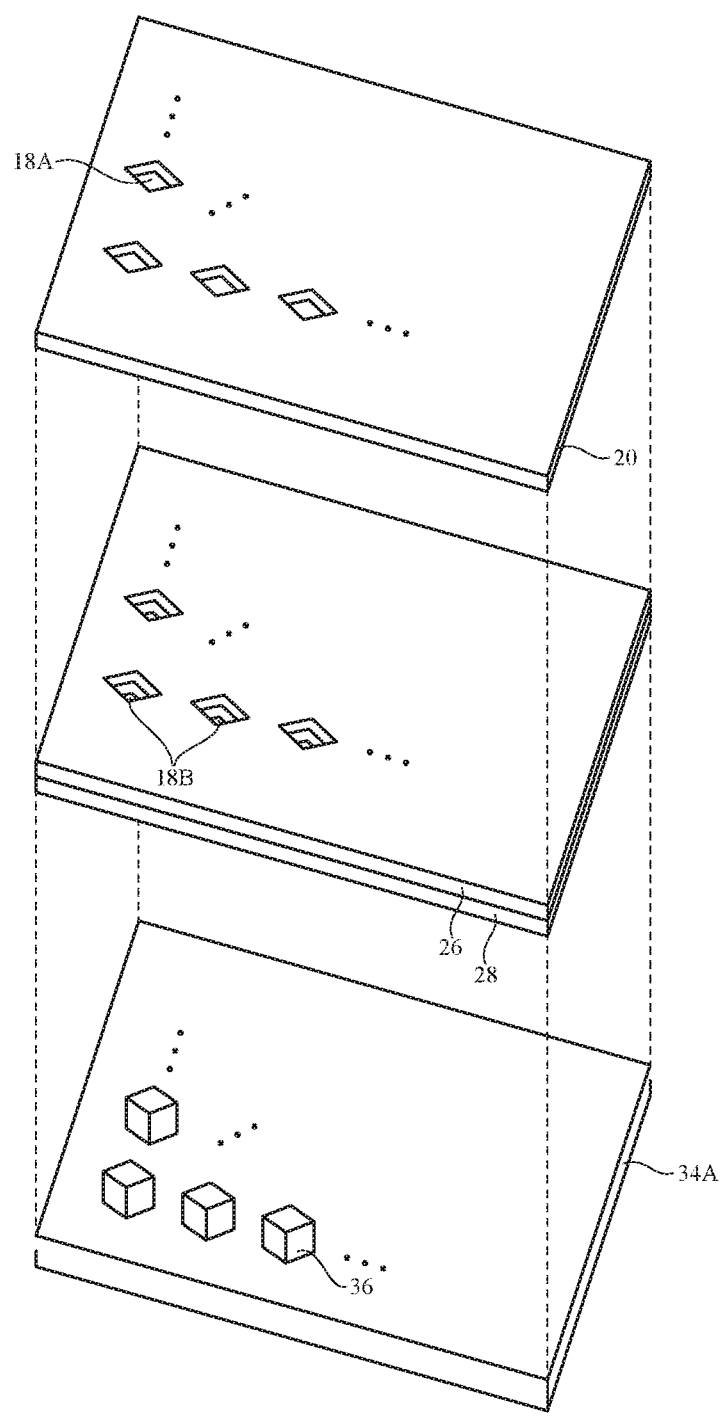
FIG. 15 is an exploded perspective view of an illustrative system being used to laminate a fabric layer with a stiffener in accordance with an embodiment.

Following lamination of adhesive 26 and stiffener 28, adhesive 26 and stiffener 28 may be laminated with fabric 20. FIG. 15 is an exploded perspective view of illustrative equipment that may be used to laminate fabric 20 to stiffener 28. As shown in FIG. 15, fabric 20, adhesive 26 and stiffener 28 may be placed onto a mold structure such as lower mold 34A. Lower mold 34A may serve as a support structure for layers 28, 26, and 20 during the lamination process. In the example of FIG. 15, stiffener 28 is placed directly on lower mold 34A and is interposed between lower mold 34A and fabric 20. This is, however, merely illustrative. If desired, fabric 20 may be placed directly on lower mold 34A and may be interposed between lower mold 34A and stiffener 28.

If desired, lower mold 34A may be provided with alignment features such as alignment posts 36. Alignment posts 36 may protrude upwards from the surface of lower mold 34A and may have a shape, size, and spacing that matches the shape, size, and spacing of holes 18A and 18B. For example, in arrangements where openings 18A and 18B have a diamond shape, alignment posts 26 may have a corresponding diamond shape that fits within openings 18A and 18B. In this way, alignment posts 36 may pass through openings 18A and 18B when layers 26, 28, and 20 are placed on lower mold 34A. This helps to ensure that the alignment of holes 18A in fabric 20 and holes 18B in stiffener 28 and adhesive 26 is maintained throughout the lamination process.

The example of FIG. 15 in which alignment posts 36 are formed in a pattern that precisely matches the pattern of openings 18A and 18B is merely illustrative. If desired, alignment post 36 may be formed with a different pattern. For example, there may be only one alignment post 36 that aligns with an opening in fabric 20, there may be one alignment post 36 at each corner of mold 34A that aligns with openings in fabric 20, or there may be any other suitable number of alignment posts 36 to assist in aligning fabric 20 with stiffener 28. If desired, alignment posts 36 may have a different shape, size, or spacing than openings 18A and 18B.

Figure 16:
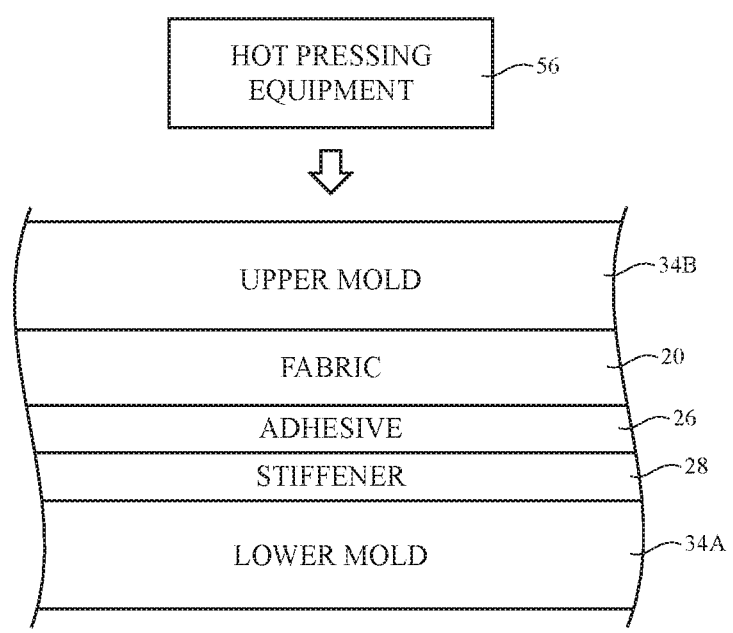
FIG. 16 is a cross-sectional side view of an illustrative system being used to laminate a fabric layer with a stiffener in accordance with an embodiment.

FIG. 16 is a system diagram showing how fabric 20 may be laminated to stiffener 28. As shown in FIG. 16, adhesive 26 may be interposed between fabric 20 and stiffener 28, and these layers may be interposed between lower mold 34A and upper mold 34B (sometimes referred to as upper and lower support structures). Lower mold 34A and upper mold 34B may, for example, be formed from thermally conductive materials such as metal.

Tool 56 may include hot pressing equipment (e.g., heated dies or other equipment for applying heat and pressure). Hot pressing equipment 56 may be used to heat and compress fabric 20, adhesive 26, and stiffener 28 between lower mold 34A and upper mold 34B. The heat and pressure from hot pressing equipment 56 may in turn activate adhesive 26 to thereby permanently attach fabric 20 to stiffener 28. If desired, the lamination process may also include a cooling step following application of heat by equipment 56. After laminating fabric 20 to stiffener 28, fabric 20 and stiffener 28 may together form a structured fabric having a desired rigidity.

If desired, hot pressing equipment 56 may be used to compress fabric 20, adhesive 26, and stiffener 28 into a desired shape. Hot pressing tools 56 may, for example, form structured fabrics with angled bends, shapes with curves, shapes with compound curves, shapes with openings (e.g., circular or rectangular holes or holes having a combination of straight and curved edges), shapes that form open pockets (e.g., open-topped boxes), shapes that form planar covering structures (e.g., shapes with portions that are configured to cover openings), etc. Molds 34A and 34B may be formed with a desired shape to produce a corresponding shape in fabric 20. This is, however, merely illustrative. If desired, fabric 20 and stiffener 28 may be laminated together as planar or substantially planar sheets and may be shaped into the appropriate form factor after lamination. Following lamination and shaping, the structured fabric may be mounted or attached to an electronic device (e.g., as shown in FIGS. 2, 3, and 4).

What is claimed is:

1. A cover for an electronic device, comprising:
a first knit fabric layer having a first array of openings;
a second knit fabric layer having a second array of openings; and
an adhesive layer interposed between the first and second knit fabric layers, wherein the adhesive layer has a third array of openings that align with the first and second arrays of openings.

2. The cover defined in claim 1 wherein the first, second, and third arrays of openings each comprise diamond-shaped openings.

3. The cover defined in claim 1 wherein at least part of the cover has a cylindrical shape.

4. The cover defined in claim 1 further comprising a stiffener interposed between the first and second knit fabric layers.

5. The cover defined in claim 4 wherein the stiffener has a fourth array of openings that align with the first, second, and third arrays of openings.

6. The cover defined in claim 5 wherein the stiffener comprises a polymer film.

7. The cover defined in claim 6 further comprising an additional adhesive layer interposed between the first and second knit fabric layers.

8. The cover defined in claim 7 wherein the stiffener is interposed between the adhesive layer and the additional adhesive layer.

9. The cover defined in claim 8 wherein the additional adhesive layer has a fifth array of openings that align with the first, second, third, and fourth arrays of openings.

10. The cover defined in claim 1 wherein at least one of the first and second knit fabric layers comprises warp knit fabric.

11. A flexible cover for a speaker, comprising:
a first cylindrical fabric portion;
a second cylindrical fabric portion;
a layer of adhesive interposed between the first and second cylindrical fabric portions; and
an array of openings that pass through the first cylindrical fabric portion, the second cylindrical fabric portion, and the layer of adhesive.

12. The flexible cover defined in claim 11 wherein at least one of the first and second cylindrical fabric portions comprises warp knit fabric.

13. The flexible cover defined in claim 11 wherein the openings are less than 10 millimeters wide.

14. The flexible cover defined in claim 11 wherein array of openings comprises rows of diamond-shaped openings that extend around a longitudinal axis of the flexible cover.

15. The flexible cover defined in claim 11 further comprising a foam layer interposed between the first and second cylindrical fabric portions.

16. A removable cover for an electronic device, comprising:
- multiple layers of fabric, including at least one warp knit fabric layer;
- adhesive that attaches the multiple layers of fabric together; and
- openings that pass through the multiple layers of fabric and the adhesive, wherein the openings permit sound from the electronic device to pass through the removable cover.

17. The removable cover defined in claim 16 further comprising a stiffener interposed between the warp knit fabric layer and the adhesive.

18. The removable cover defined in claim 17 wherein the stiffener comprises a material selected from the group consisting of: metal and polymer.

19. The removable cover defined in claim 16 wherein the openings are diamond-shaped.

20. The removable cover defined in claim 16 wherein the multiple layers of fabric surround a cavity that receives the electronic device.

\* \* \* \* \*